United States Patent [19]
Okamoto

[11] Patent Number: 5,712,874
[45] Date of Patent: Jan. 27, 1998

[54] NOISE SHAPER CAPABLE OF GENERATING A PREDETERMINED OUTPUT PATTERN IN NO-SIGNAL CONDITION

[75] Inventor: Toshiyuki Okamoto, Tokyo, Japan

[73] Assignee: NEC Corpoation, Tokyo, Japan

[21] Appl. No.: 350,964

[22] Filed: Dec. 7, 1994

[30] Foreign Application Priority Data

Dec. 7, 1993 [JP] Japan ................................ 5-306849

[51] Int. Cl.[6] .................................................. H04B 14/04
[52] U.S. Cl. ........................ 375/243; 375/350; 341/143; 341/200
[58] Field of Search ....................... 375/229, 243, 375/247, 354, 350; 341/126, 143, 144, 155, 200; 364/724.01, 724.2

[56] References Cited

U.S. PATENT DOCUMENTS

| | | | |
|---|---|---|---|
| 5,278,559 | 1/1994 | Yazawa | 341/143 |
| 5,420,892 | 5/1995 | Okamoto | 375/229 |
| 5,493,297 | 2/1996 | Nguyen et al. | 341/143 |

OTHER PUBLICATIONS

Chao et al., "A Higher Order Topology for Interpolative Modulators for Oversampling A/D Converters," IEEE Transactions on Circuits and Systems, vol. 37, No. 3, Mar. 1990, pp. 309–318.

Longo et al., "A 13 bit ISDN–band Oversampled ADC using Two–Stage Third Order Noise Shaping," IEEE 1988 Custom Integrated Circuits Conference, pp. 21.2.1–21.2.4.

Primary Examiner—Stephen Chin
Assistant Examiner—Don Vo
Attorney, Agent, or Firm—Foley & Lardner

[57] ABSTRACT

In a noise shaper comprising first and second cascaded integrators, a quantizer receiving an output signal of the second integrator, and a feedback path for feeding back an output of the quantizer to each of the first and second integrators, the first integrator includes an adder having a first input receiving art input signal applied to the first integrator, a delay circuit receiving an output of the adder to output a one-sample-delayed signal, and a multiplying circuit having an input connected to an output of the delay circuit for multiplying the one-sample-delayed signal outputted from the delay circuit, by a positive coefficient "0.999". An output of the multiplying circuit is connected to a second input of the adder. An output of the delay circuit constitutes the output of the first integrator.

14 Claims, 5 Drawing Sheets

NOISE SHAPER CAPABLE OF GENERATING A PREDETERMINED OUTPUT PATTERN IN NO-SIGNAL CONDITION

BACKGROUND OF THE INVENTION

1. Field of the Invention

The present invention relates to noise shaper, and more particularly to noise shaper capable of stably performing its operation, when it is powered on, or when an input signal is brought into a no-signal condition, ceaselessly with a constant noise characteristics including an S/N ratio (signal-to-noise) and a distortion characteristics, without depending upon an initial value of an integrator included in the noise shaper.

2. Description of Related Art

Referring to FIG. 1, there is shown a block diagram of one example of a conventional noise shaper.

The shown noise shaper is generally designated by the Reference Numeral 100, and is constructed to receive a one-bit input signal $V_{IN}$ and a one-bit output signal $V_{OUT}$. The noise shaper 100 comprises a first subtracter 11, a first integrator 102, a second subtracter 13, a second integrator 14, a quantizer 15, a delay 16 and a multiplier 17, connected as shown in FIG. 1.

The first subtracter 11 has a minuend input connected to receive the input signal $V_{IN}$ and a subtrahend input connected to an output of the delay 16, so as to output a difference between the input signal $V_{IN}$ and an output signal of the delay 16. The first integrator 102 has an input connected to an output of the first subtracter 11 so as to integrate an output signal of the first subtracter 11. The second subtracter 13 has a minuend input connected to an output of the first integrator 102 and a subtrahend input connected to an output of the multiplier 17, so as to output a difference between an output signal of the first integrator 102 and an output signal of the multiplier 17. The second integrator 14 is connected to an output of the second subtracter 13 so as to integrate an output signal of the second subtracter 13.

The quantizer 15 has an input connected to an output of the second integrator 14, and outputs "+1" when the output of the second integrator 14 is larger than "0", and also outputs "−1" if it is not larger than "0", for the purpose of quantize the output of the second integrator 14. An output of the quantizer 15 constitutes the output signal $V_{OUT}$ of the noise shaper 100. The delay 16 has an input connected to the output of the quantizer 15, and delays the output signal $V_{OUT}$ of the noise shaper 100, by one sample, so that a one-sample-delayed signal is fed back to an input of the multiplier 17 and the subtrahend input of the first subtracter 11. The multiplier 17 doubles the output of the delay 16. Thus, the one-sample-delayed signal is fed back to the first and second integrators 102 and 14.

Referring to FIG. 2A, the first integrator 102 includes a first adder 111 having a first input receiving an input signal applied to the first integrator 102, and a first delay circuit 112 receiving an output of the first adder 111 to feed back a one-sample-delayed signal to a second input of the first adder 111. An output of the first delay circuit 112 constitutes the output of the first integrator 102. Accordingly, the first integrator 102 functions to integrate the output signal of the first subtracter 11 by obtaining a sum of a current data of the output signal of the first subtracter 11 shown in FIG. 1 and a data-before-one-sample (data stored before one sample) of the output signal of the first subtracter 11.

Referring to FIG. 2B, the second integrator 14 includes a second adder 121 having a first input receiving an input signal applied to the second integrator 14, and a second delay circuit 122 receiving an output of the second adder 121 to feed back a one-sample-delayed signal to a second input of the second adder 121. An output of the second adder 121 constitutes the output of the second integrator 14. Accordingly, the second integrator 14 functions to integrate the output signal of the second subtracter 13 by obtaining a sum of a current data of the output signal of the second subtracter 13 shown in FIG. 1 and a data-before-one-sample (data stored before one sample) of the output signal of the second subtracter 13.

Now, operation of the noise shaper 100 shown in FIG. 1 will be described.

The first integrator 102 integrates a difference (which is the output signal of the first subtracter 11) between the current data of the input signal $V_{IN}$ and a data-before-one-sample of the output signal $V_{OUT}$ (which is the output signal of the delay 16). The second integrator 14 integrates a difference (which is the output signal of the second subtracter 13) between the output of the first integrator 102 and the data (which is the output of the multiplier 17) obtained by doubling the data-before-one-sample of the output signal $V_{OUT}$. As mentioned above, the quantizer 15 outputs "+1" when the output of the second integrator 14 is larger than "0", and also outputs "−1" if it is not larger than "0".

Accordingly, assuming that a quantization noise generated in the quantizer 15 is "Q", a relation between an input signal $V_{IN}$ and an output signal $V_{OUT}$ of the noise shaper 100 can be expressed by the following formula:

$$V_{OUT}(z)=V_{IN}(z)+(1-z^{-1})^2 \cdot Q(z) \tag{1}$$

Consequently, an output spectrum of the noise shaper 100 becomes a spectrum formed by superposing a signal obtained by the second-order differentiation of the quantization noise, on the input signal of the noise shaper 100. Namely, the quantization noise is shaped and superposed in a high frequency region, so that the sum of the noise in a signal band is remarkably reduced.

However, the above mentioned conventional noise shaper 100 have the following disadvantage when an input signal is put in a no-signal condition.

Now, assuming that both the output of the first delay circuit 112 included in the first integrator 102 and the output of the second delay circuit 122 included in the second integrator 14 are "0" (zero) in an initial condition, and also assuming that the output signal of the delay 16 in the feedback loop is "1", the output signal $V_{OUT}$ of the noise shaper 100 changes in an output signal pattern "−1", "−1", "1", "−1", "1", "1", "−1", "−1", . . . . On the other hand, assuming that the output of the first delay circuit 112 included in the first integrator 102 is "1", the output signal $V_{OUT}$ of the noise shaper 100 changes in a different output signal pattern "−1", "1", "−1", "1", "1", "−1", "−1", "1", . . . . Accordingly, the output pattern of the noise shaper 100 varies dependently upon the initial values of the first integrator 102 and the second integrator 14.

Here, the term "initial value" is used to mean an output value of an integrator such as the first integrator 102 and the second integrator 14, at the moment the input signal $V_{IN}$ becomes a no-signal condition.

Ordinarily, when the voltage supply is powered on, it is possible to fix or reset to "0" (zero) the initial value of the output signal of each of the first integrator 102 and the second integrator 14 included in the noise shaper 100. In operation, however, if the input signal $V_{IN}$ applied to the noise shaper 100 suddenly becomes a no-signal condition, the initial values of the output signals of the first integrator 102 and the second integrator 14 included in the noise shaper 100 have various values.

On the other hand, the output signal $V_{OUT}$ of the noise shaper 100 is applied to a succeeding D/A (digital-w-analog) converter (not shown) where it is converted into an analog signal. In general, the D/A converter has characteristics different from ideal characteristics, because of variation in analog elements constituting the D/A converter. Ordinarily, the characteristics of the D/A converter is dependent upon the digital signal applied to the D/A converter.

As mentioned above, since the output signal $V_{OUT}$ of the noise shaper 100 in the no-signal condition takes various different patterns, the analog signal obtained from the D/A converter similarly assumes different characteristics. Because of this, the conventional noise shaper 100 has adopted an approach of detecting whether or not the input signal $V_{IN}$ is "0" (zero), for forcibly bringing the output signal pattern to for example "1", "−1", "1", "−1", . . . , when the input signal $V_{IN}$ is "0" (zero). For realizing this approach, it is necessary to add an extra circuit for detecting whether or not the input signal $V_{IN}$ is "0" (zero). In addition, a delay in time from the moment the input signal $V_{IN}$ becomes "0" (zero) until the moment it is actually detected that the input signal $V_{IN}$ is "0" (zero), is a problem such a system.

SUMMARY OF THE INVENTION

Accordingly, it is an object of the present invention to provide a noise shaper which has overcome the above mentioned defect of the conventional one.

Another object of the present invention is to provide a noise shaper capable of simply outputting a single predetermined output signal pattern in the no-signal condition.

The above and other objects of the present invention are achieved in accordance with the present invention by a noise shaper comprising at least two cascaded integration means, a quantizing means receiving an output signal of a final stage integration means of the at least two cascaded integration means, and a feedback means for feeding back an output of the quantizing means to each integration means of the at least two cascaded integration means, at least one integration means of the at least two cascaded integration means being configured to add a current data of an input signal applied to the at least one integration means, with data obtained by multiplying a data-before-one-sample of the input signal applied to the at least one integration means, by a positive coefficient smaller than "1", the other integration means of the at least two cascaded integration means being configured to add a current data of an input signal applied to the same integration means, with a data-before-one-sample of the input signal applied to the same integration means.

As mentioned above, in the noise shaper in accordance with the present invention, the at least one integration means of the at least two cascaded integration means is configured to add a current dam of an input signal applied to the at least one integration means, with data obtained by multiplying a data-before-one-sample of the input signal applied to the at least one integration means, by a positive coefficient smaller than "1". Namely, the at least one integration means constitutes an incomplete integrator, which outputs an output signal which gradually becomes "0" (zero) with the lapse of time, when no signal is applied, namely, when the input signal is put in a no-signal condition.

On the other hand, the other integration means is constructed in the form of a complete integrator. The initial value of the other integration means in the form of the complete integrator, influences the output signal of the quantizing means in a transient condition, but becomes a steady condition with the lapse of time.

Accordingly, when the input signal becomes the no-signal condition, a single predetermined pattern is outputted from the noise shaper, regardless of the initial value of each of the integration means included in the noise shaper.

In a preferred embodiment, the noise shaper in accordance with the present invention includes a first subtracting means having a first input receiving an input signal, a first integrating means receiving an output of the first subtracting means, a second subtracting means having a first input receiving an output of the first integrating means, a second integrating means receiving an output of the second subtracting means, a quantizing means receiving an output of the second integrating means, and for outputting an output signal, and a feedback means for feeding back the output of the quantizing means to a second input of each of the first and second subtracting means, the first integrating means being configured to add a current data of the output of the first subtracting means with data obtained by multiplying a data-before-one-sample of the output of the first subtracting means by a positive coefficient smaller than "1", the second integration means being configured to add a current data of the output of the second subtracting means with a data-before-one-sample of the output of the second subtracting means.

In a specific embodiment, the feedback means includes a delay means for delaying the output of the quantizing means by one sample. In another specific embodiment, the feedback means includes a delay means for delaying the output of the quantizing means by one sample and for supplying an output of the delay means to the second input of the first subtracting means, and a multiplying means for multiplying the output of the delay means by a positive coefficient so as to apply the multiplied output to the second input of the second subtracting means.

The above and other objects, features and advantages of the present invention will be apparent from the following description of preferred embodiments of the invention with reference to the accompanying drawings.

DESCRIPTION OF THE PREFERRED EMBODIMENTS

Figure 3:
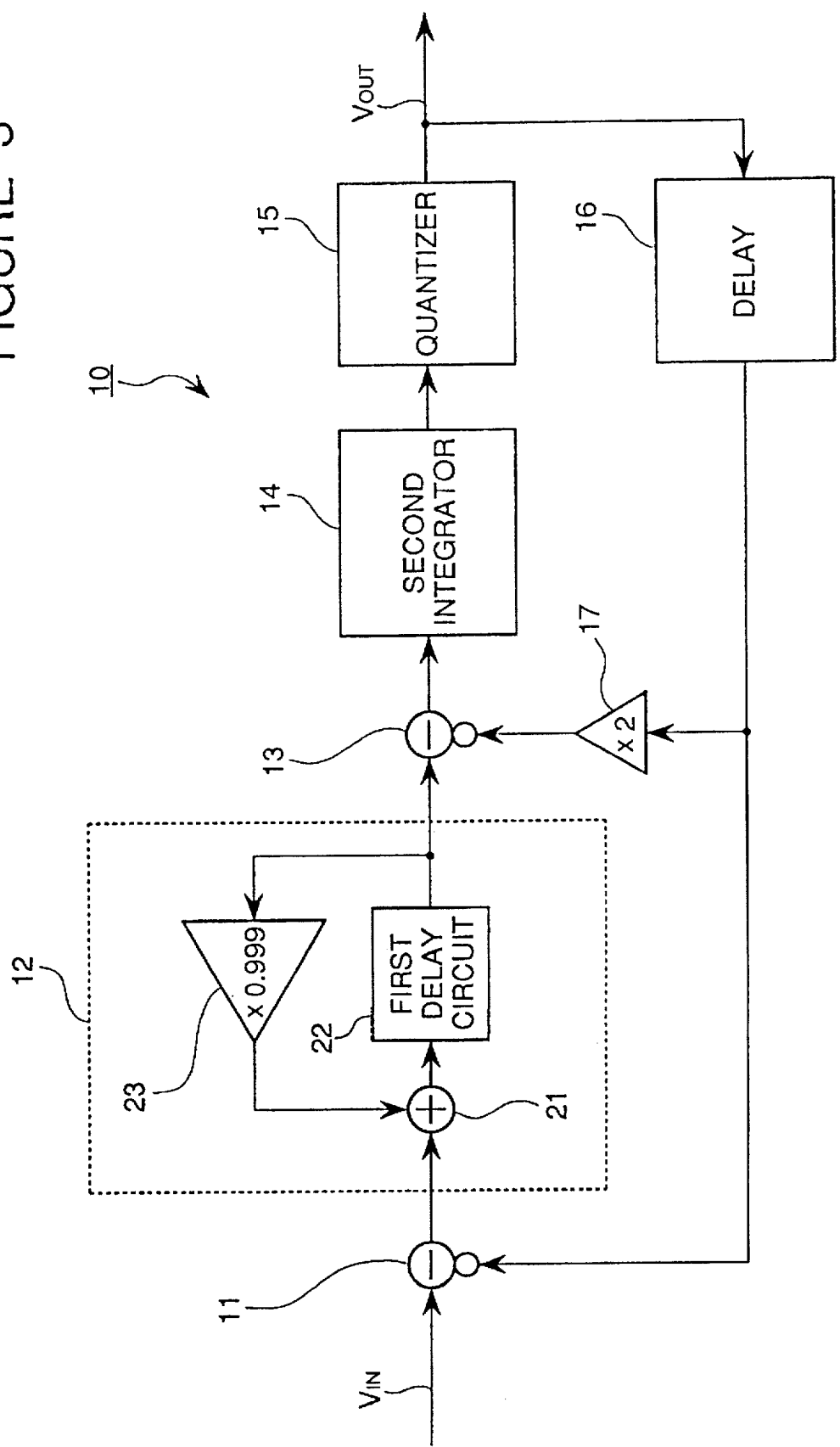
FIG. 3 is a block diagram of a first embodiment of the noise shaper in accordance with the present invention.

Referring to FIG. 3, there is shown a block diagram of a first embodiment of the noise shaper in accordance with the present invention. In FIG. 3, elements corresponding to those shown in FIG. 1 are given the same Reference Numerals, and explanation thereof will be omitted for simplification of the description.

Figure 1:
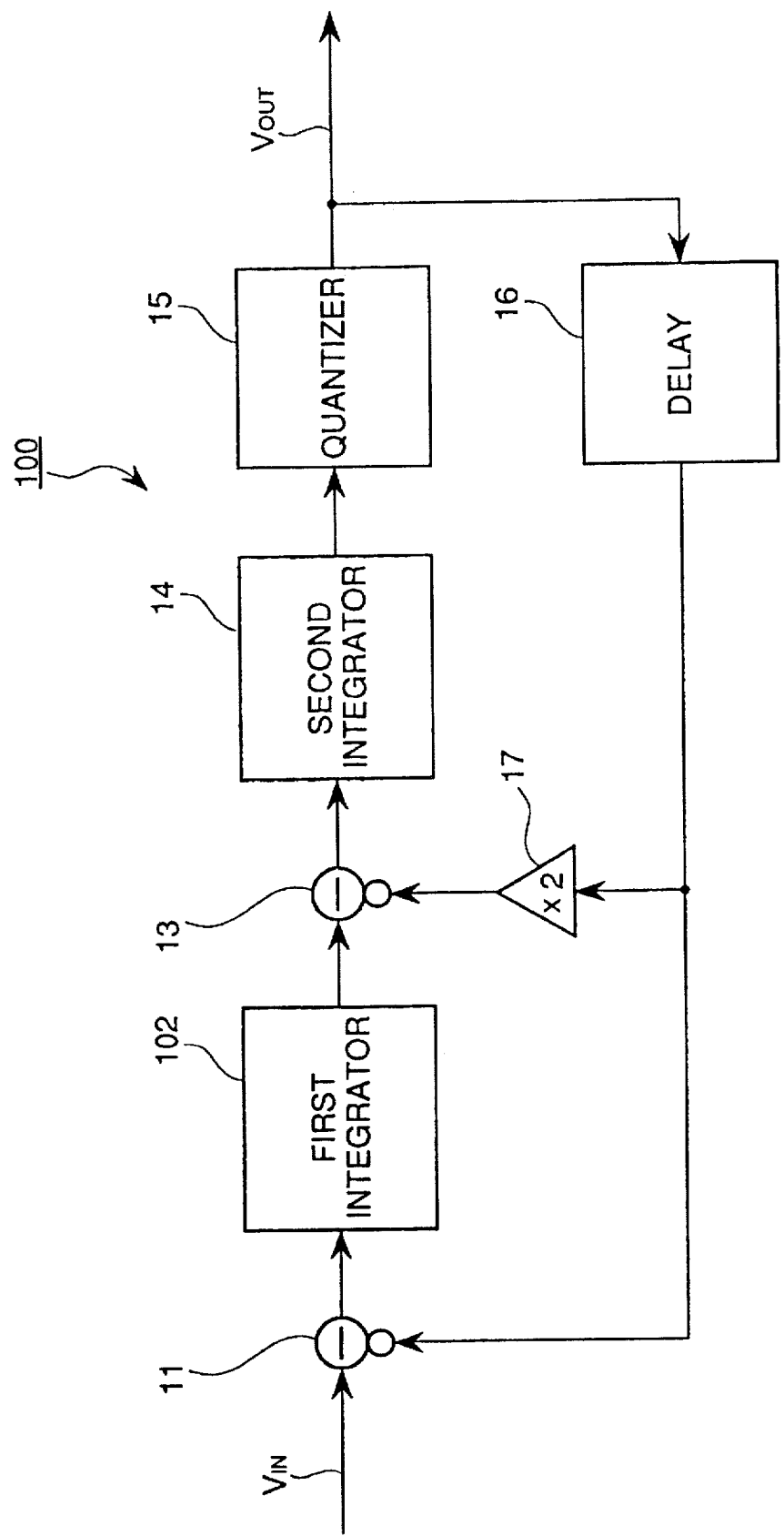
FIG. 1 is a block diagram of one example of a conventional noise shaper.
Figure 2A:
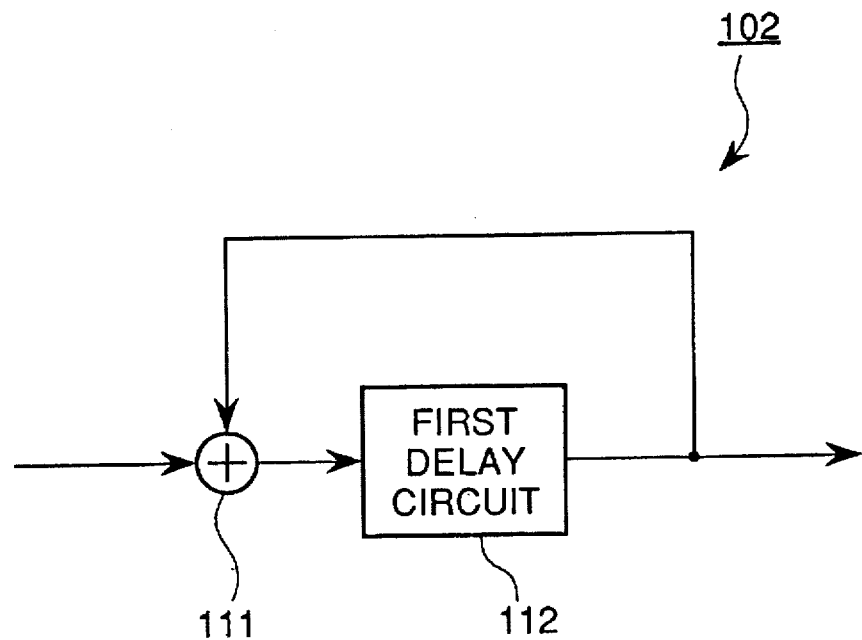
FIGS. 2A and 2B are circuit diagrams of the first integrator and the second integrator included in the noise shaper shown in FIG. 1, respectively.
Figure 2B:
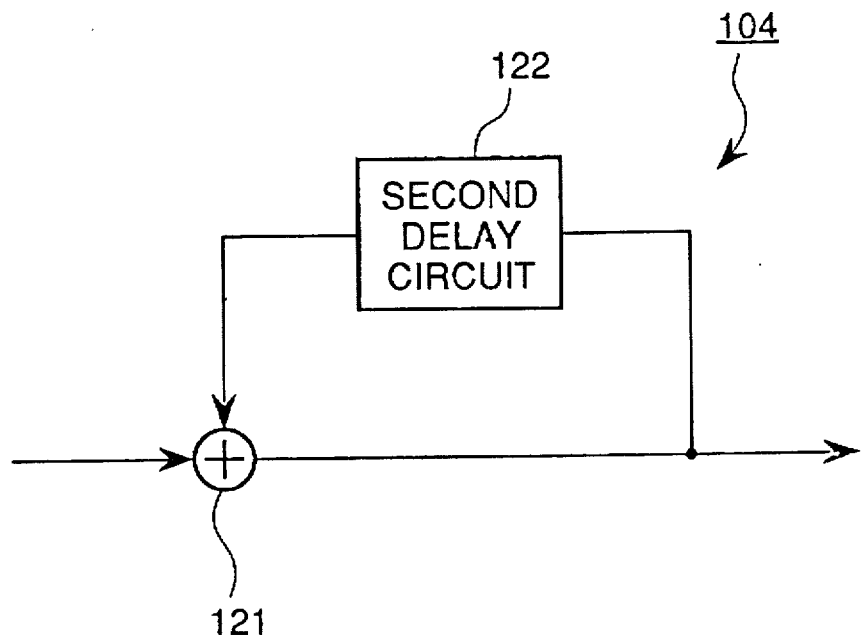

As seen from comparison between FIGS. 1 and 3, a noise shaper 10 shown in FIG. 3 is different from the noise shaper 100 shown in FIG. 1 only in that the first integrator 102 of the noise shaper 100 is replaced with a first integrator 12 which has a multiplying circuit in its feedback loop.

As shown in FIG. 3, the first integrator 12 includes a first adder 21 having a first input receiving an input signal applied to the first integrator 12 (namely, the output of the first subtracter 11), a first delay circuit 22 receiving an output of the first adder 21 to output a one-sample-delayed signal, and a multiplying circuit 23 having an input connected to an output of the first delay circuit for multiplying the one-sample-delayed signal outputted from the first delay circuit 22, by a positive coefficient "0.999", an output of the multiplying circuit 23 being connected to a second input of the first adder 21. An output of the first delay circuit 22 constitutes the output of the first integrator 12, namely, is connected to the minuend input of the second subtracter 13.

Accordingly, the first integrator 12 constitutes an incomplete integrator which functions to integrate the output signal of the first subtracter 11 by obtaining a sum of a current data of the output signal of the first subtracter 11 and the 0.999-multiplied data-before-one-sample (data stored before one sample) of the output signal of the first subtracter 11.

In the noise shaper 10 as mentioned above, accordingly, assuming that a quantization noise generated in the quantizer 15 is "Q", a relation between an input signal $V_{IN}$ and an output signal $V_{OUT}$ of the noise shaper can be expressed by the following formula:

$$V_{OUT}(z)=(z^{-1}/P(z))\cdot V_{IN}(z)+(1-z^{-1})(1-0.999\cdot z^{-1})\cdot Q(z)/P(z) \quad (2)$$

where $P(z)=0.001\cdot z^{-2}+0.001\cdot z^{-1}+1$

In the above mentioned formula (2), P(z) is substantially "1" independently of frequency. Consequently, an output spectrum of the noise shaper 10 becomes a spectrum formed by superposing a signal obtained by the second-order differentiation of the quantization noise, on the input signal $V_{IN}$ of the noise shaper 10. Namely, the quantization noise is shaped and superposed in a high frequency region, so that the sum of the noise in a signal band is remarkably reduced, without substantially deteriorating the noise shaping characteristics of the conventional noise shaper.

In the noise shaper 10 as shown in FIG. 3, when the input signal $V_{IN}$ becomes the no-signal condition, since the first integrator 12 has a leak integration construction so as to accumulatively integrate the 0.999 times the integration amount, the output (integration amount) of the first integrator 12 becomes "0" (zero) with the lapse of time.

On the other hand, the initial value of the second integrator 14 in the form of a complete integrator influences the output signal of the quantizer 15 in a transient condition, but becomes a steady condition with the lapse of time.

Accordingly, when the input signal $V_{IN}$ becomes the no-signal condition, a single predetermined pattern is outputted from the noise shaper 10, regardless of the initial value of each of the two integrators 12 and 14 included in the noise shaper 10.

Figure 4:
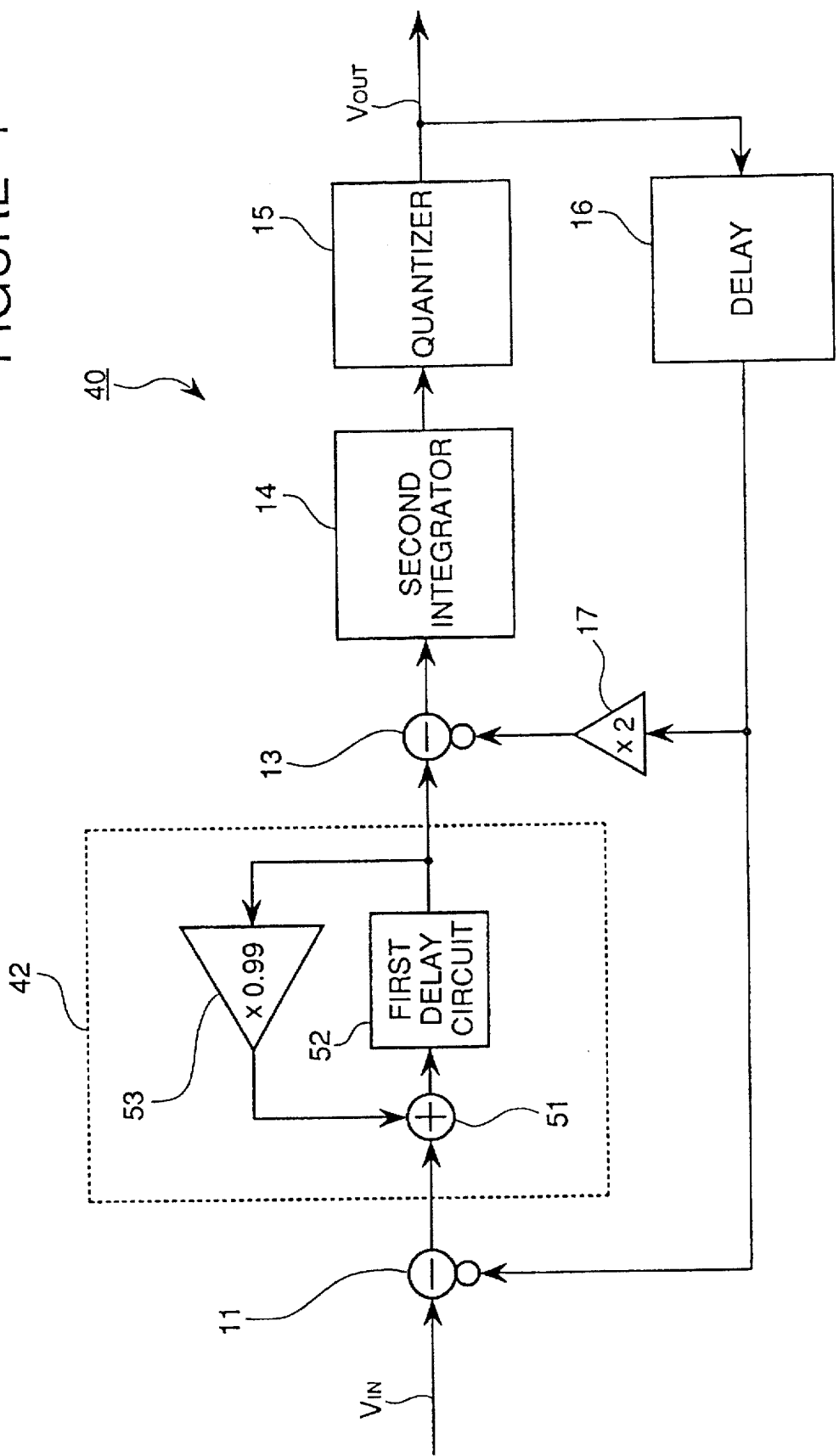
FIG. 4 is a block diagram of a second embodiment of the noise shaper in accordance with the present invention.

Referring to FIG. 4, there is shown is a block diagram of a second embodiment of the noise shaper in accordance with the present invention. In FIG. 4, elements corresponding to those shown in FIG. 3 are given the same Reference Numerals, and explanation thereof will be omitted for simplification of the description.

A noise shaper 40 of the second embodiment is different from the first embodiment only in that the first integrator 12 of the first embodiment is replaced with a first integrator 42 which includes a multiplying circuit configured to multiply the received signal by a coefficient "0.99".

More specifically, the first integrator 42 shown in FIG. 4 includes a first adder 51 having a first input receiving an input signal applied to the first integrator 42 (namely, the output of the first subtracter 11), a first delay circuit 52 receiving an output of the first adder 51 to output a one-sample-delayed signal, and a multiplying circuit 53 having an input connected to an output of the first delay circuit 52 for multiplying the one-sample-delayed signal outputted from the first delay circuit 52, by a positive coefficient "0.99", an output of the multiplying circuit 53 being connected to a second input of the first adder 51. An output of the first delay circuit 52 constitutes the output of the first integrator 42, namely, is connected to the minuend input of the second subtracter 13.

Accordingly, the first integrator 42 as shown in FIG. 4 constitutes an incomplete integrator which functions to integrate the output signal of the first subtracter 11 by obtaining a sum of a current data of the output signal of the first subtracter 11 and the 0.99-multiplied data-before-one-sample (data stored before one sample) of the output signal of the first subtracter 11.

In the above mentioned noise shaper shown in FIG. 4, accordingly, assuming that a quantization noise generated in the quantizer 15 is "Q", a relation between an input signal $V_{IN}$ and an output signal $V_{OUT}$ of the noise shaper 10 can be expressed by the following formula:

$$V_{OUT}(z)=(z^{-1}/P(z))\cdot V_{IN}(z)+(1-z^{-1})(1-0.99\cdot z^{-1})\cdot Q(z)/P(z) \quad (3)$$

where $P(z)=0.01\cdot z^{-2}+0.01\cdot z^{-1}+1$

In the above mentioned formula (3), P(z) is substantially "1" independently of frequency. Consequently, an output spectrum of the noise shaper 40 becomes a spectrum formed by superposing a signal obtained by the second-order differentiation of the quantization noise, on the input signal $V_{IN}$ of the noise shaper 40. Namely, the quantization noise is shaped and superposed in a high frequency region, so that the sum of the noise in a signal band is remarkably reduced, without substantially deteriorating the noise shaping characteristics of the conventional noise shaper.

In the noise shaper 40 shown in FIG. 4, when the input signal $V_{IN}$ becomes the no-signal condition, since the first integrator 42 has a leak integration construction so as to accumulatively integrate the 0.99 times the integration amount, the output (integration amount) of the first integrator 42 becomes "0" (zero) with the lapse of time.

On the other hand, the initial value of the second integrator 14 in the form of a complete integrator influences the output signal of the quantizer 15 in a transient condition, but becomes a steady condition with the lapse of time.

Accordingly, when the input signal $V_{IN}$ becomes the no-signal condition, a single predetermined pattern is outputted from the noise shaper 10, regardless of the initial value of each of the two integrators 42 and 14 included in the noise shaper.

Here, it is to noted that, the larger the integration leak of the first integrator 42 is, namely, the smaller the multiplying coefficient in the first integrator 42, the time required until the output pattern becomes steady, becomes long, but the deterioration of the S/N ratio can be reduced.

Figure 5:
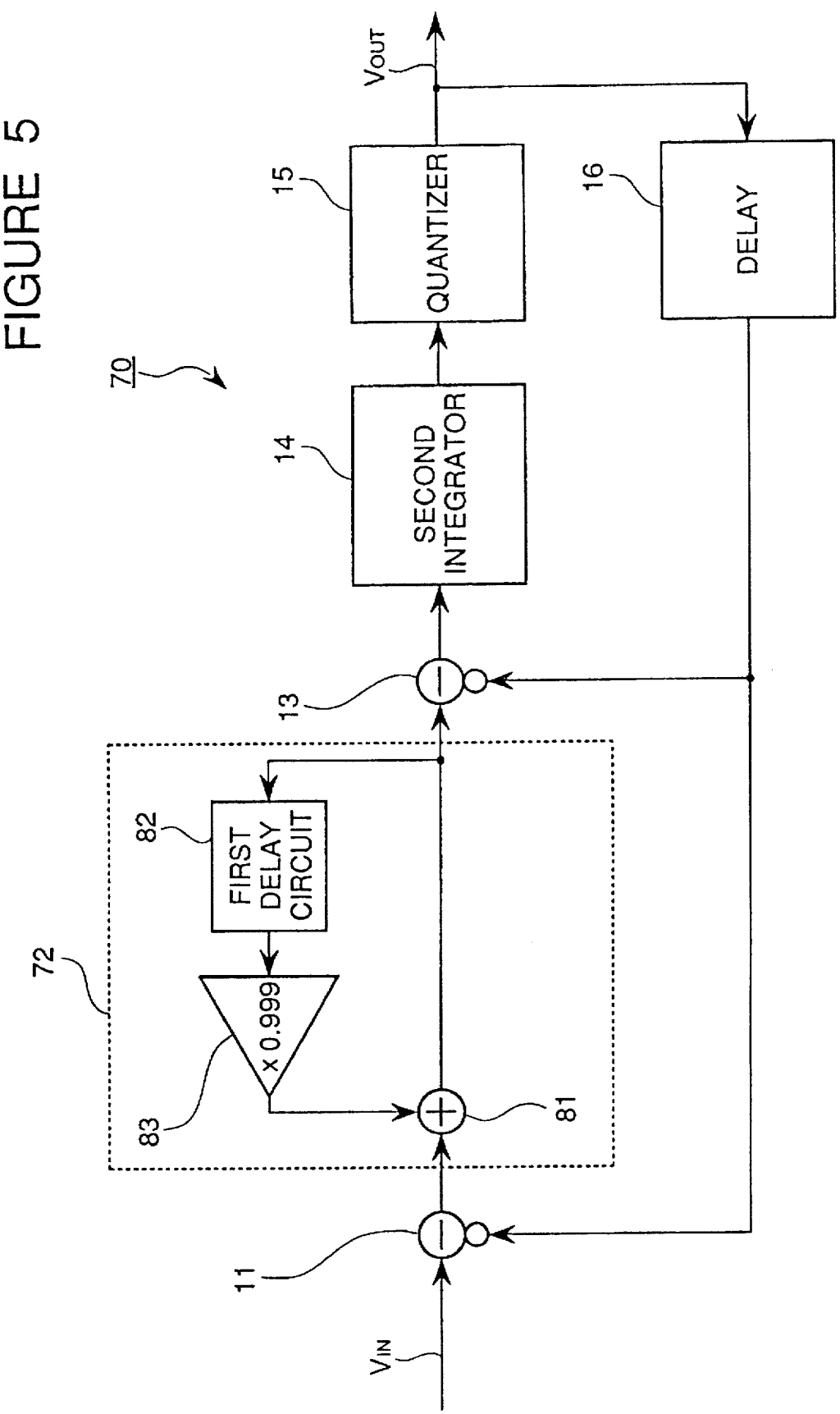
FIG. 5 is a block diagram of a third embodiment of the noise shaper in accordance with the present invention.

Referring to FIG. 5, there is shown a block diagram of a third embodiment of the noise shaper in accordance with the present invention. In FIG. 5, elements corresponding to those shown in FIG. 3 are given the same Reference Numerals, and explanation thereof will be omitted for simplification of the description.

As will be seen from comparison between FIGS. 3 and 5, a noise shaper 70 of the third embodiment shown in FIG. 5 is different from the first embodiment shown in FIG. 3, in which the multiplier 17 shown in FIG. 3 is omitted, and the first integrator 12 shown in FIG. 3 is replaced with a first integrator 72 as shown in FIG. 5.

As shown in FIG. 5, the first integrator 72 includes a first adder 81 having a first input receiving an input signal applied to the first integrator 72 (namely, the output of the first subtracter 11), a first delay circuit 82 receiving an output of the first adder 81 to output a one-sample-delayed signal, and a multiplying circuit 83 having an input connected to an output of the first delay circuit 82 for multiplying the one-sample-delayed signal outputted from the first delay circuit 82, by a positive coefficient "0.999", an output of the multiplying circuit 83 being connected to a second input of the first adder 81. An output of the first adder 81 constitutes the output of the first integrator 72, namely, is connected to the minuend input of the second subtracter 13. The first delay circuit 82 and the multiplying circuit 83 are located only in a feedback path to the first adder 81.

Accordingly, the first integrator 72 constitutes an incomplete integrator which functions to integrate the output signal of the first subtracter 11 by obtaining a sum of a current data of the output signal of the first subtracter 11 and the 0.999-multiplied data-before-one-sample (dam stored before one sample) of the output signal of the first subtracter 11.

In the noise shaper 70 as mentioned above, accordingly, assuming that a quantization noise generated in the quantizer 15 is "Q", a relation between an input signal $V_{IN}$ and an output signal $V_{OUT}$ of the noise shaper 70 can be expressed by the following formula:

$$Vhd\ OUT(z) = (z^{-1} / P(z)) \cdot V_{IN}(z) + (1-z^{-1})(1-0.999 \cdot z^{-1}) \cdot Q(z) P(z) \quad (4)$$

where $P(z) = 0.001 \cdot z^{-1} + 1$

In the above mentioned formula (4), P(z) is substantially "1" independently of frequency. Consequently, an output spectrum of the noise shaper 70 becomes a spectrum formed by superposing a signal obtained by the second-order differentiation of the quantization noise, on the input signal $V_{IN}$ of the noise shaper 70. Namely, the quantization noise is shaped and superposed in a high frequency region, so that the sum of the noise in a signal band is remarkably reduced, without substantially deteriorating the noise shaping characteristics of the conventional noise shaper.

In the noise shaper 70 as shown in FIG. 5, when the input signal $V_{IN}$ becomes the no-signal condition, since the first integrator 72 has a leak integration construction so as to accumulatively integrate the 0.999 times the integration amount, the output (integration amount) of the first integrator 72 becomes "0" (zero) with the lapse of time.

On the other hand, the initial value of the second integrator 14 in the form of a complete integrator, influences the output signal of the quantizer 15 in a transient condition, but becomes a steady condition with the lapse of time.

Accordingly, when the input signal $V_{IN}$ becomes the no-signal condition, a single predetermined pattern is outputted from the noise shaper 70, regardless of the initial value of each of the two integrators 72 and 14 included in the noise shaper 70.

As seen from the above, the noise shaper in accordance with the present invention is such that, when the input signal is brought into the no-signal condition, the output signal pattern is put in a predetermined single pattern without deteriorating the S/N ratio. Accordingly, when the output of the noise shaper in accordance with the present invention is connected to a D/A converter, the D/A converter can operate stably, even if the characteristics of the D/A converter is different from an ideal characteristics because of variations in analog elements included in the D/A converter.

Furthermore, the noise shaper in accordance with the present invention makes unnecessary an extra circuit for detecting whether or not the input signal is "0" (zero).

The invention has thus been shown and described with reference to the specific embodiments. However, it should be noted that the present invention is in no way limited to the details of the illustrated structures but changes and modifications may be made within the scope of the appended claims.

I claim:

1. A noise shaper comprising:
   at least two cascaded integration means,
   a quantizing means receiving an output signal of a final stage integration means of said at least two cascaded integration means, and
   a feedback means for feeding back an output of said quantizing means to each integration means of said at least two cascaded integration means,
   at least one integration means of said at least two cascaded integration means being configured to perform leak integration by adding (i) a current data of an input signal applied to said at least one integration means with (ii) data obtained by multiplying a data-before-one-sample of the input signal applied to said at least one integration means by a positive coefficient smaller than but substantially equal to "1",
   one other integration means of said at least two cascaded integration means being configured to add a current data of an input signal applied to the one other integration means with a data-before-one-sample of the input signal applied to the one other integration means,
   wherein the leak integration performed by said at least one integration means includes an accumulative integration of a resulting integration amount multiplied by said positive coefficient smaller than but substantially equal to "1" so that, in a no-signal condition, the output of said at least one integration means becomes "0" with a lapse of time and a single predetermined pattern is outputted from the noise shaper.

2. A noise shaper claimed in claim 1 wherein said at least one integration means includes:
   an adder having a first input receiving an input signal applied to said at least one integration means,
   a delay circuit receiving an output of said adder to output a one-sample-delayed signal, and
   a multiplying circuit having an input connected to an output of said delay circuit for multiplying the one-sample-delayed signal outputted from said delay circuit by said positive coefficient,
   an output of said multiplying circuit being connected to a second input of said adder, and
   an output of said delay circuit constituting the output of said at least one integration means.

3. A noise shaper claimed in claim 1 wherein said at least one integration means includes:
   an adder having a first input receiving an input signal applied to said at least one integration means,
   a delay circuit receiving an output of said adder to output a one-sample-delayed signal, and
   a multiplying circuit having an input connected to an output of said delay circuit for multiplying the onesample-delayed signal outputted from said delay circuit by said positive coefficient, an output of said multiplying circuit being connected to a second input of said adder, and the output of said adder constituting the output of said at least one integration means.

4. A noise shaper comprising:

a first subtracting means having a first input receiving an input signal, a first integrating means receiving an output of said first subtracting means, a second subtracting means having a first input receiving an output of said first integrating means, a second integrating means receiving an output of said second subtracting means, a quantizing means receiving an output of said second integrating means and for outputting an output signal, and a feedback means for feeding back the output signal of said quantizing means to a second input of each of said first and second subtracting means, said first integrating means being configured to perform leak integration by adding a current data of the output of said first subtracting means with data obtained by multiplying a data-before-one-sample of the output of said first subtracting means by a positive coefficient smaller than but substantially equal to "1", and said second integration means being configured to add a current data of the output of said second subtracting means with a data-before-one-sample of the output of said second subtracting means, wherein the leak integration performed by said first integration means includes an accumulative integration of a resulting integration amount multiplied by said positive coefficient smaller than but substantially equal to "1" so that, in a no-signal condition, the output of said at least one integration means becomes "0" with a lapse of time and a single predetermined pattern is outputted from the noise shaper.

5. A noise shaper claimed in claim 4 wherein said feedback means includes a delay means for delaying the output of said quantizing means by one sample.

6. A noise shaper claimed in claim 4 wherein said feedback means includes:

a delay means for delaying the output of said quantizing means by one sample and for supplying an output of said delay means to the second input of said first subtracting means, and a multiplying means for multiplying the output of said delay means by a positive coefficient so as to supply the multiplied output to the second input of said second subtracting means.

7. A noise shaper claimed in claim 4 wherein said first integrating means includes:

an adder having a first input connected to the output of said first subtracting means, a delay circuit receiving an output of said adder to output a one-sample-delayed signal, and a multiplying circuit having an input connected to an output of said delay circuit for multiplying the one-sample-delayed signal outputted from said delay circuit by said positive coefficient, an output of said multiplying circuit being connected to a second input of said adder, and an output of said delay circuit being connected to the first input of said second subtracting means.

8. A noise shaper claimed in claim 7 wherein said feedback means includes:

a delay means for delaying the output of said quantizing means by one sample and for supplying an output of said delay means to the second input of said first subtracting means, and a multiplying means for multiplying the output of said delay means by a positive coefficient so as to supply the multiplied output to the second input of said second subtracting means.

9. A noise shaper claimed in claim 7 wherein said positive coefficient is 0.999.

10. A noise shaper claimed in claim 7 wherein said positive coefficient is 0.99.

11. A noise shaper claimed in claim 4 wherein said first integrating means includes:

an adder having a first input connected to the output of said first subtracting means, a delay circuit receiving an output of said adder to output a one-sample-delayed signal, and a multiplying circuit having an input connected to an output of said delay circuit for multiplying the one-sample-delayed signal outputted from said delay circuit by said positive coefficient, an output of said multiplying circuit being connected to a second input of said adder, and an output of said adder being connected to the first input of said second subtracting means.

12. A noise shaper claimed in claim 11 wherein said feedback means includes a delay means for delaying the output of said quantizing means by one sample.

13. A noise shaper comprising:

first and second integrators arranged in a cascaded manner; and a quantizer receiving an output signal of the second integrator, wherein an output of the quantizer is fed back to the first and second integrators, wherein the first integrator performs leak integration by adding (i) a current data of an input signal applied to the first integrator with (ii) data obtained by multiplying a data-before-one-sample of the input signal supplied to the first integrator by a positive coefficient smaller than but substantially equal to 1, wherein the second integrator performs no-leak integration by adding (i) a current data of an input signal supplied to the second integrator with (ii) data-before-one-sample of the input signal applied to the second integrator, and wherein the leak integration at the first integrator includes an accumulative integration of a resulting integration amount multiplied by said positive coefficient smaller than but substantially equal to 1 so that, in a no-signal condition, the output of the first integrator becomes 0 with a lapse of time and a single predetermined pattern is outputted from the noise shaper.

14. A noise shaper claimed in claim 13 wherein said positive coefficient is greater than or equal to 0.99.

* * * * *